FIELD-EFFECT TRANSISTOR WITH REDUCED CAPACITANCE BETWEEN GATE AND CHANNEL

Filed Dec. 17, 1962 2 Sheets-Sheet 1

INVENTOR.
STEVEN R. HOFSTEIN
BY
W. S. Hill
AGENT

INVENTOR.
STEVEN R. HOFSTEIN
BY
W. S. Hill
AGENT 3,296,508

FIELD-EFFECT TRANSISTOR WITH REDUCED CAPACITANCE BETWEEN GATE AND CHANNEL

Steven R. Hofstein, Neshanic, N.J., assignor to Radio Corporation of America, a corporation of Delaware Filed Dec. 17, 1962, Ser. No. 245,086
3 Claims. (Cl. 317—235)

This invention relates to an improved field-effect transistor, which is also referred to as a unipolar transistor. The invention relates particularly to an improved planar-type field-effect transistor especially useful for operation at high frequencies.

A field effect transistor comprises generally a channel of low resistivity semiconductor material and two spaced electrical contacts to the channel, which are referred to as the source and the drain. A field-effect transistor includes also a gate electrode adjacent and electrically separated from the channel. When a voltage is applied between the source and the drain, majority charge carriers flow through the channel from the source to the drain. The magnitude of the carrier current may be modulated, by modulating the drain-to-source voltage and/or appplying a modulating voltage to the gate electrode.

There are several types of field-effect transistors. In a planar-type field-effect transistor, the channel, the source, and the drain are constructed along the surface of a body, usually the surface of a semiconducting or insulating substrate.

It is known that the electrical characteristics, particularly the highest operating frequency, of a planar-type device may be increased by reducing the channel length (distance from source to drain), and reducing the length of the gate (linear dimension of the gate in the direction of the length of the channel). However, it is impractical to manufacture devices having a channel length and a gate length below some minimum dimension which is dependent upon the manufacturing technology. Thus, the manufacturing technology determines the minimum channel length and therefore determines certain of the operating characteristics of the device.

An object of this invention is to provide an improved planar-type field-effect transistor.

Another object is to provide a planar-type field-effect transistor having a minimum channel length as determined by the manufacturing technology and an improved high frequency response.

In general, the planar field-effect transistor of the invention comprises a channel, a source, and a drain constructed along a surface of a semiconductor body as in the prior art. The gate electrode, however, is offset toward the source and away from the drain so that there is a greater distance between the drain and the gate than there is between the source and the gate. In a preferred embodiment, the gate overlaps the source. As used herein, the source is that electrode from which majority charge carriers flow into the channel.

By offsetting the gate electrode in this manner, without changing the channel length or the gate length, the capacitance between the drain and the gate electrode is reduced, thereby reducing the coupling between the input and the output of the device. The reduced input-to-output circuit coupling improves the stability characteristic of analogue circuits in which the device is used. In switching circuits, this reduced coupling improves the speed of response. This is achieved at the expense of a higher capacitance between the source and the gate electrode, which has a relatively minor effect on the operating characteristics of the device, and which may be tuned out by a proper selection of the associated circuit components.

During the operation of a planar field-effect transistor, one portion of the channel effectively appears as a resistance between the source and that region of the channel which is gated when a gate voltage is applied; and another portion of the channel effectively appears as a resistance between the drain and that region of the channel which is gated when a gate voltage is applied. By offsetting the gate electrode toward the source as described above, the one resistance between the source and the gated region of the channel is reduced, while the other resistance between the drain and the gated region of the channel is increased. The reduction of resistance between the source and gated region has the effect of increasing the transconductance of the device, since this resistance is common to the input and output circuits and is degenerative. In addition, the reduced resistance between source and gated region reduces the input circuit time constant and hence extends the upper frequency limit at which the device is operable. It should be noted that the increase in source-to-gate capacitance can be compensated by external circuit means.

More than one gate electrode may be used in the device of the invention. In this application all of the gate electrodes are considered together and are referred to as the gate electrode structure. Unlike previous unipolar transistors where more than one gate electrode is used, the gate electrode structure is continuous with respect to a portion of the channel length, so that the resistance in the channel between the source and the gate electrode structure is minimized at the expense of the resistance between the drain and the gate electrode structure.

A more detailed description of the invention and illustrative embodiments thereof appear below in conjunction with the drawings, in which.

Similar reference numerals are used for similar elements throughout the drawings.

Figure 1:
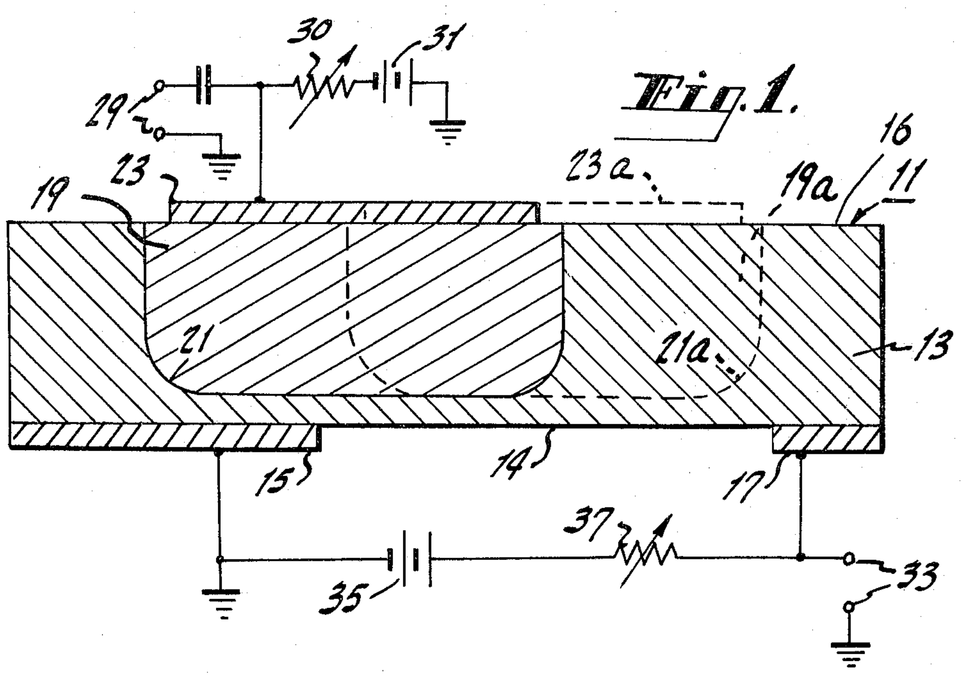
FIGURE 1 is a sectional view of a first embodiment of a planar field-effect transistor of the invention having a junction type gate electrode internal to a semiconductor body.

FIGURE 1 illsutrates a first embodiment of a planar field-effect transistor 11 of the invention. The transistor 11 comprises a relatively low resistivity base 13 of N-type semiconductor material. The base 13 is a single crystal wafer having two opposed surfaces 14 and 16. The base 13 may be of any of the semiconductor materials used to prepare transistors in the semiconductor art. For purpose of illustration, the base 13 is a single crystal body of N-type germanium having a resistivity of about 1 ohm-cm. On one surface 14 of the base 13 are located two spaced metal electrodes 15 and 17, which function as the source and the drain respectively. A P-type region 19 which constitutes the gate electrode of the device extends from the opposite surface 16 of the base 13 inwardly toward the one surface 14. The interface between the P-type region and the N-type portion 13 is a P–N junction 21, which is spaced a short distance from the one surface 14 and is substantially parallel to the one surface 14 over some substantial area. The space between the P–N junction 21 and the one surface 14 in the region between the source 15 and the drain 17 defines the channel of the device. A gate connection 23 of metal connects to the P-type region 19.

FIGURE 1 also includes a circuit for using the device of FIGURE 1 as an amplifier. The circuit shown is typical of a common-source connection circuit. The circuit includes a pair of input terminals 29 for applying an input signal to the gate connection 23. One input terminal is grounded. The other input terminal is connected in series to the gate connection 23 together with means for biasing the gate electrode 19 in the reverse direction with respect to the source and drain. As shown, the gate biasing means comprises a variable gate bias resistor 30 and a battery 31 connected at one end to the gate connection 23 and grounded at the other end. A negative bias is applied to the gate electrode 19 through the gate connection 23. The circuit includes also a pair of output terminals 33 for deriving an output signal from the device 11. One output terminal 33 is connected to the drain 17 and to means for biasing the drain electrode 17 with respect to ground. The drain biasing means may comprise a battery 35 connected at one end to ground and at the other end serially with a variable load resistor 37 to the drain electrode 17 and output terminal 33. The source 15 is grounded and the drain 17 is biased positively with respect to the source electrode 15.

An important feature of the embodiment of FIGURE 1 is that the gate electrode, which is defined by the P–N junction 21, is offset toward the source 15 so that it overlaps a substantial portion of the source 15, while there is effectively no overlap over the drain 17. This offset structure is to be compared with a conventional gate structure, which is shown by the dotted lines in FIGURE 1 to indicate the usual position of the P-type gate electrode 19*a*, the P–N junction 21*a*, and the gate connection 23*a*. By offsetting the gate from the position shown by the dotted lines to the position shown by the solid lines, the device may be operated at significantly higher frequencies and exhibits better operating stability than the previous device.

Figure 2:
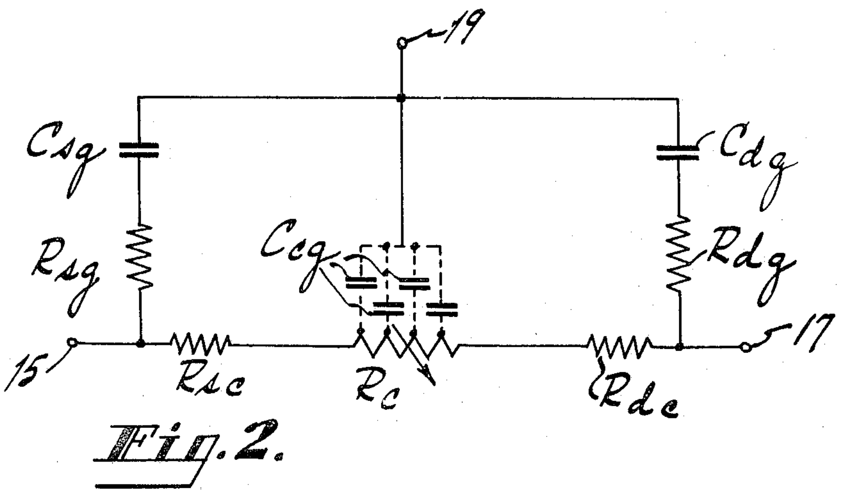
FIGURE 2 is an equivalent circuit of the field-effect transistor of FIGURE 1.

One explanation for the improvement achieved by offsetting the gate 21 may be made in connection with the equivalent circuit shown in FIGURE 2. The equivalent circuit for the unipolar transistor of FIGURE 1 comprises a source capacitance $C_{sg}$ and a source resistance $R_{sg}$ in series between the gate 19 and the source 15, and a drain capacitance $C_{dg}$ and a drain resistance $R_{dg}$ in series between the gate 19 and the drain 17. The equivalent circuit also includes a distributed capacitance $C_{cg}$ between the gate 19 and the gated portion of the channel of the device. The equivalent circuit considers that there are three resistances in series between the source 15 and the drain 17. There is a first resistance $R_{sc}$ between the source and the gated portion of the channel; a second resistance $R_c$ of the gated portion of the channel; and a third resistance $R_c$ of the gated portion of the channel; and a third resistance $R_{dc}$ between the drain 17 and the gated portion of the channel. The equivalent circuit also considers that there are three capacitances associated with the gate of the device. There is a first capacitance $C_{sg}$ between the source and the gate, a second capacitance $C_{dg}$ between the drain and the gate, and a third distributed capacitance $C_{cg}$ between the gate and the channel. Because the second capacitance $C_{dg}$ is an important part of the input capacitance of the device, it is desirable that it be as low as possible; although the other capacitances should also be low. By offsetting the gate 19 as shown in FIGURE 1, $C_{dg}$ is reduced and therefore the effective input capacitance is reduced by an amount which is a function of the amount of offset. The overall transconductance of the device is improved because the resistance $R_{sc}$ is an unbypassed degenerative resistance common to the input and output circuits.

Increases in $R_{dc}$ have little effect on the usual operation of the device, since $R_{dc}$ is usually small compared with the load resistor, such as the resistor 37 in FIGURE 1, normally in the circuit. Increases in $C_{sg}$ have little effect on the usual operation of the device, especially because this capacitance can be compensated for by a suitable inductance in the operating circuit.

Offsetting the gate toward the source according to the invention may be used for one or more of the following purposes: (1) to reduce the coupling between the input and output of the device, (2) to increase the operating frequency of the device and its associated circuit, and (3) to improve the transconductance of the device.

Figure 3:
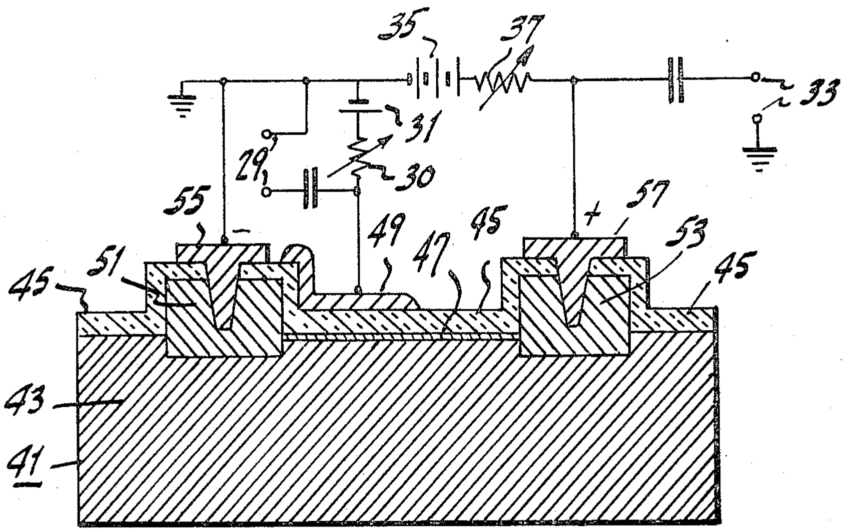
FIGURE 3 is a sectional view of a second embodiment of a planar field-effect transistor of the invention having a single insulated gate electrode external to the semiconductor substrate.

FIGURE 3 illustrates a second embodiment of a planar field-effect transistor of the invention which has an insulated gate external to the substrate of the device. The device 41 comprises a high resistivity base 43 of semiconductor material. The base 43 may be either single crystal or may be polycrystalline; and may be any one of the semiconductor materials used to prepare transistors in the semiconductor art.

The base 43 includes a reacted region comprising a high resistivity layer 45 of converted body material and a low resistivity channel 47 between the bulk of the base 43 and the high resistivity layer 45 of converted body material. For purposes of illustration, the base 43 in FIGURE 3 is a single crystal body of P-type silicon having a resistivity of about 100 ohm-cm. and is about 10 mils thick. The high resistivity layer 45 is produced by oxidizing a portion of the surface of the base 43. The high resistivity layer 45 is about 2,000 A. thick and consists essentially of pure silicon oxide produced by completely oxidizing the silicon of the base 43. The low resistivity channel 47 is produced at the same time as the high resistivity layer 45 and is sometimes referred to as an inversion layer. The channel 47 extends under the entire high resistivity layer 45 and may be described as partially oxidized silicon, which is transitional between the pure silicon of the base 43 and the silicon oxide of the high resistivity layer 45. The channel 47 is believed to have a low resistivity by virtue of attracting free charge carriers thereto which compensate for unbalanced electronic charges in the partially converted semiconductor material of the channel 47.

A gate electrode 49, preferably of a metal such as aluminum is disposed on the high resistivity layer 45 opposite and spaced from the channel 47. The gate electrode 49 is offset toward a source region 51 and away from a drain region 53. As illustrated in FIGURE 3, the gate electrode 49 extends opposite the channel 47 and then over the source region 51.

The source region 51 is in the base 43 and connects to one end of the channel 47. Similarly the drain region 53 is in the base 43 and connects to the other end of the channel 47. The length of the channel 47, which is the distance between the source region 51 and the drain region 53, is about five mils. As illustrated, the source region 51 and the drain region 53 are regions of the base 43 into which N-type impurities have been diffused to render them conducting. Any of the structures which make a suitable connection to the channel 47 may be used as the source region 51 and the drain region 53.

A source region electrode 55 contacts a part of the source 51. A drain region electrode 57 contacts a part of the drain 53. The source and drain electrodes 55 and 57 are preferably of a metal, such as aluminum, and may be produced in the same step and of the same material as the gate electrode 49.

FIGURE 3 also includes a circuit for operating the transistor 41 as an amplifier. The circuit, which is of the common source type, is similar to that illustrated in FIGURE 1. In one mode of operation, the drain voltage $V_d$ and drain current $I_d$ are adjusted to the desired values as by adjusting the variable load resistor 37 and the variable gate bias resistor 30. A signal voltage $V_g$ is applied to the input terminals 29. For a device having a channel length of about 0.5 mil, the frequency response can extend into the kilomegacycle range. Drain (conventional) current $I_d$ flows from ground through the voltage source 35, through the load resistor 37, the drain region electrode 57, through the drain 53, the channel 47, the source region 51, the source electrode 55 to ground. Majority charge carriers flow in the opposite direction in this embodiment. The transistor may be used to translate from a high impedance input to a low impedance output, to amplify the input signal, or both to translate and to amplify.

The transistor illustrated in FIGURE 3 may be prepared by the following process. A 100 ohm-cm. P-type silicon wafer about 18 mils thick is chemically polished to a thickness of 10 mils. A uniform layer of phosphorus doped silicon oxide is thermally deposited upon one surface of the wafer by heating for about 10 minutes at 75° C. in an atmosphere of argon which has been bubbled through trimethyl-phosphate and tetraethyl-orthosilicate. The deposited oxide is consolidated by heating for about 5 minutes at 75° C. in an atmosphere of argon which has bubbled through silane. A photoresist pattern is now deposited upon the consolidated oxide and the oxide etched away leaving the doped consolidated oxide over those areas which are to be the source and drain regions and removing the doped oxide from the region between source and drain. The wafer is now heated at about 900° C. in oxygen to grow a new silicon oxide layer in the region between source and drain and produce an inversion layer under this layer, and to simultaneously produce a diffusion of impurities from the doped consolidated oxide into the wafer. This diffusion forms the highly doped source-drain regions. Then, the wafer is coated with a photoresist and etched to provide access through the oxide layer into the source and drain regions. Then aluminum metal is evaporated over the entire surface of the wafer. A photoresist is now applied and the aluminum metal is etched away from the surface of the wafer except where the source electrode, the drain electrode and the gate electrode are to be located. It is at this step that the shape of the gate electrode is defined. The only change from a prior method is simply to offset the mask which defines the gate electrode. Finally, the wafer is diced and suitable leads connected to the source, drain and gate electrodes.

Figure 4:
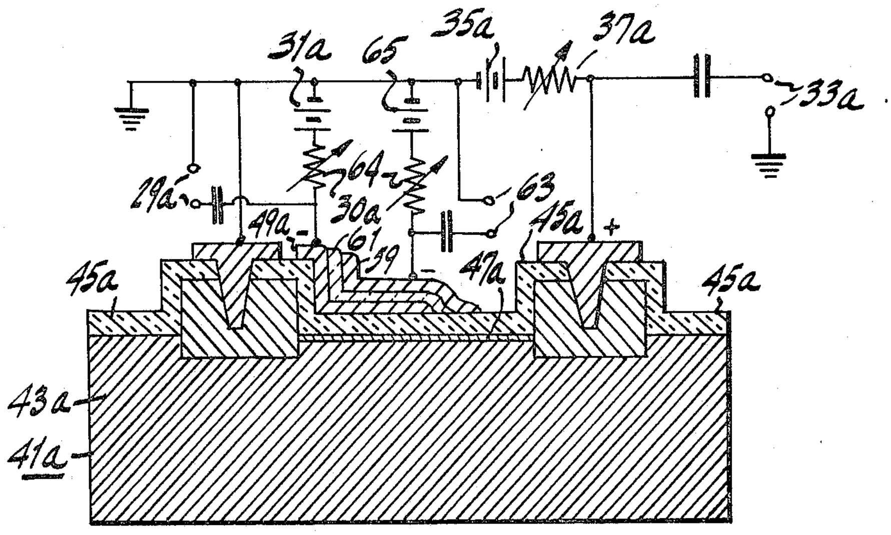
FIGURE 4 is a sectional view of a third embodiment of a field-effect transistor of the invention having two insulated gate electrodes external to the semiconducting substrate.

FIGURE 4 illustrates a third embodiment of a planar transistor of the invention. The transistor 41a of FIGURE 4 is the same as the transistor illustrated in FIGURE 3 except that an additional second gate electrode 59 is provided, which is insulated from the first gate electrode 49a by a high resistivity layer 61. A unipolar transistor having two (or more) gate electrodes has been suggested previously. Heretofore, the two (or more) gate electrodes have been physically spaced along the length of the channel. This spacing of the gate electrodes produces, not only the resistances $R_c$, $R_{sc}$ and $R_{dc}$ mentioned above, but also produces additional resistances along the channel opposite the space between adjacent gate electrodes.

It has been found on analysis that all of the gate electrodes should be considered as a single gate electrode structure. In order to achieve improved operating characteristics in a planar field effect transistor, it is necessary in the practice of this invention to provide a continuous gate electrode structure. By this is meant that the one or more gate electrodes present to the channel a continuous face with no spaces therebetween. To this end, the embodiment of FIGURE 4 provides a second gate electrode 59 which is insulated from the first electrode 49a. Also, the continuous gate electrode structure (comprising the two gate electrodes 49a and 59) is offset toward the source region 51a and away from the drain region 53a in the manner described with respect to the device of FIGURE 3.

The circuit included in FIGURE 4 is similar to the circuit described in FIGURE 3 except that a second pair of input terminals 63 are provided, together with suitable means 65 for biasing the gate electrode 59.

What is claimed is:

1. A field-effect transistor comprising a body of semiconductor material of one conductivity type and having a substantially planar external surface, a channel in said body extending entirely adjacent and substantially parallel to said surface, a source ohmic electrode adjacent said surface connected to one end of said channel, a drain ohmic electrode adjacent said surface connected to the other end of said channel, said source and drain electrodes defining the ends of a charge carrier path through said channel substantially parallel to said surface, and a single continuous gate electrode structure adjacent said channel and opposite a continuous portion of said current path, said gate electrode structure comprising a region of semiconductor material in said body of conductivity type opposite to that of said channel and the remainder of said body, and an ohmic gate connection to said region, one end of said region and one end of said gate connection being closer physically to said source electrode than the other ends of said region and said gate connections are to said drain electrode.

2. A field-effect transistor comprising a body of semiconductor material having a substantially planar surface, a thin layer of insulating material on said surface, a semiconductor channel in said body and extending entirely adjacent and substantially parallel to said surface, a source region adjacent said surface connected to one end of said channel, a drain region adjacent said surface connected to the other end of said channel, said source and said drain regions defining the ends of a charge carrier path through said channel substantially parallel to said surface, and a single continuous gate electrode structure comprising at least one metallic electrode on said insulating layer and opposite a continuous portion of said charge carrier path, one end of said gate electrode structure being closer physically to said source region than the other end of said gate electrode structure is to said drain region.

3. A field-effect transistor as defined in claim 2 wherein said insulating layer is a genetic layer derived from the material of said body.

References Cited by the Examiner

UNITED STATES PATENTS

| | | | |
|---|---|---|---|
| 2,750,542 | 6/1956 | Armstrong et al. | 317—235 |
| 2,900,531 | 8/1959 | Wallmark | 317—235 |
| 2,921,265 | 1/1960 | Teszner | 317—235 |
| 2,930,950 | 3/1960 | Teszner | 317—235 |
| 2,971,140 | 2/1961 | Chappey et al. | 317—235 |
| 3,001,111 | 9/1961 | Chappey | 317—235 |

FOREIGN PATENTS 1,037,293 9/1953 France.

OTHER REFERENCES

"Proceedings of the IEEE," September 1963, pp. 1190–1202.

JOHN W. HUCKERT, *Primary Examiner.*

J. D. KALLAM, C. E. PUGH, *Assistant Examiners.*